United States Patent
Kim

(10) Patent No.: US 7,471,583 B2
(45) Date of Patent: Dec. 30, 2008

(54) MEMORY DEVICE WITH SELF REFRESH CYCLE CONTROL FUNCTION

(75) Inventor: Jee-Yul Kim, Kyoungki-do (KR)

(73) Assignee: Hynix Semiconductor Inc., Kyoungki-Do (KR)

( * ) Notice: Subject to any disclaimer, the term of this patent is extended or adjusted under 35 U.S.C. 154(b) by 56 days.

(21) Appl. No.: 11/527,692

(22) Filed: Sep. 27, 2006

(65) Prior Publication Data

US 2007/0070760 A1 Mar. 29, 2007

(30) Foreign Application Priority Data

Sep. 29, 2005 (KR) ............... 10-2005-0090913
May 31, 2006 (KR) ............... 10-2006-0049122

(51) Int. Cl.
*G11C 7/04* (2006.01)

(52) U.S. Cl. ............ 365/211; 365/222; 365/210.11; 365/189.07

(58) Field of Classification Search ........ 365/222, 365/210.11, 211, 189.07
See application file for complete search history.

(56) References Cited

U.S. PATENT DOCUMENTS

| | | | |
|---|---|---|---|
| 6,850,448 B2 | 2/2005 | Schnabel et al. | |
| 7,038,968 B2 | 5/2006 | Kim | |
| 7,214,910 B2 * | 5/2007 | Chen et al. ........... | 219/494 |
| 2005/0074051 A1 * | 4/2005 | Won et al. ........... | 374/170 |
| 2005/0105352 A1 * | 5/2005 | Lee .................... | 365/202 |
| 2005/0134393 A1 * | 6/2005 | Kim et al. ............ | 331/36 C |
| 2005/0228611 A1 | 10/2005 | Kim | |
| 2006/0066386 A1 | 3/2006 | Hong | |
| 2006/0087901 A1 | 4/2006 | Hong et al. | |
| 2006/0159156 A1 * | 7/2006 | Lee et al. ............ | 374/183 |
| 2006/0190210 A1 * | 8/2006 | Mukherjee ........... | 702/130 |
| 2007/0019488 A1 * | 1/2007 | Heilmann et al. ..... | 365/211 |

FOREIGN PATENT DOCUMENTS

| | | |
|---|---|---|
| JP | 2003-132678 | 5/2003 |
| JP | 2005-222574 | 8/2005 |
| KR | 10-0129197 B1 | 11/1997 |
| KR | 10-2006-0104904 A | 10/2006 |
| KR | 10-2006-0118733 A | 11/2006 |

OTHER PUBLICATIONS

Korean Office Action, with English translation, issued in Korean Patent Application No. KR 10-2006-0049122, mailed Jul. 24, 2007.
Korean Office Action issued in corresponding Korean Patent Application No. KR 10-2006-0049122, issued on Jan. 9, 2008.

* cited by examiner

*Primary Examiner*—Thong Q Le
(74) *Attorney, Agent, or Firm*—McDermott Will & Emery LLP

(57) ABSTRACT

Provided is a memory device capable of automatically controlling a self refresh cycle by sensing an ambient temperature, rather than setting Extended Mode Register Set (EMRS) code. The memory device includes a temperature sensing unit for generating a first voltage independent of a temperature variation and a second voltage dependent upon a temperature variation, a comparing unit for comparing the first voltage with the second voltage to provide a comparison result signal, and a self refresh signal generating unit for receiving a self refresh entry signal and generating a self refresh signal of temperature compensated cycle under the control of the comparison result signal.

28 Claims, 6 Drawing Sheets

MEMORY DEVICE WITH SELF REFRESH CYCLE CONTROL FUNCTION

FIELD OF THE INVENTION

The present invention relates to semiconductor design technologies, and more particularly, to a memory device with a self refresh cycle control function.

DESCRIPTION OF RELATED ART

In general, since Dynamic Random Access Memory (DRAM) cells are arranged in a dynamic way, data destruction happens due to leakage current. Therefore, it is required to read out the data in memory cells and again recharge them to an initial charge amount according to the read data before the cell data becomes lost owing to lack thereof to the extent that it is not sensed. This recharging process of memory cells is called refresh. Besides, a self refresh implies that a semiconductor memory device of DRAM performs the refresh in a fixed cycle for itself in order to maintain the data stored in memory cells in a standby state.

On the other hand, the feature of leakage current is that it increases twice when the temperature rises by 10° C. In other words, the hold time of cell data decreases to ½ when the temperature rises by 10° C., and decreases to 1/32 when it rises by 50° C.

As described above, the leakage current is intimately associated with the temperature; and thus, the refresh cycle is affected by the temperature serving as an important factor. Namely, the self refresh cycle should be short at a relatively high temperature.

Therefore, Temperature Compensated Self Refresh (TCSR) is necessary to regulate the self refresh cycle by detecting an ambient temperature.

Conventionally, a device in which a user programs a cycle variation according to a temperature variation has been used. That is, the conventional device varies the self refresh cycle according to an address number 7 in the course of setting Extended Mode Register Set (EMRS).

In the conventional TCSR cycle generation device, the self refresh cycle is varied depending on the temperature set by the user. If such conventional device is used at low temperature at which data preservation time is relatively long compared to a high temperature, the self refresh cycle is set to be longer. Conversely, if such conventional device is utilized at the high temperature, the self refresh cycle is set to be shorter by EMRS code setting to make the self refresh cycle frequent. By doing so, it is possible to secure the normal operation of DRAM.

FIG. 1 shows a block diagram of a conventional memory device with a self refresh cycle control function.

First, an oscillator 10 is enabled by a self refresh entry signal SREF to generate a basic self refresh signal srefreg. Upon receipt of the basic self refresh signal srefreg, a frequency divider 20 performs a frequency division thereof, determines a divided value in response to a selection signal HTSRRES from an EMRS block 30, and provides a self refresh signal newsrefreg having a final self refresh cycle required. The EMRS code setting is decided based on the address number 7.

As mentioned above, in the conventional self refresh, the TCSR is carried out by setting the EMRS code by the specific address, as required in the related spec. However, if the temperature to be used is out of the spec, the DRAM operation cannot be secured, which limits the use thereof.

SUMMARY OF THE INVENTION

It is, therefore, an object of the present invention to provide a memory device capable of automatically controlling a self refresh cycle by sensing an ambient temperature, rather than setting EMRS code.

In accordance with one aspect of the present invention, there is provided a memory device with a self refresh cycle control function, including: a temperature sensing unit for generating a first voltage independent of a temperature variation and a second voltage dependent upon a temperature variation; a comparing unit for comparing the first voltage with the second voltage to provide a comparison result signal; and a self refresh signal generating unit for receiving a self refresh entry signal and generating a self refresh signal of temperature compensated cycle under the control of the comparison result signal.

In accordance with another aspect of the present invention, there is provided a memory device with a self refresh cycle control function, including: a temperature sensing unit for generating a first voltage independent of a temperature variation and a second voltage dependent upon a temperature variation; a comparing unit for comparing the first voltage with the second voltage to provide a comparison result signal; an oscillating unit for receiving and oscillating a self refresh entry signal; and a frequency dividing unit for dividing an output of the oscillating unit and providing one of a plurality of divided values as a self refresh signal in response to the comparison result signal.

In accordance with still another aspect of the present invention, there is provided a memory device with a self refresh cycle control function, including: a temperature sensing unit for generating a first voltage independent of a temperature variation and a second voltage dependent upon a temperature variation; a comparing unit for comparing the first voltage with the second voltage to provide a comparison result signal; an oscillating unit for receiving and oscillating a self refresh entry signal, wherein an oscillating period is controlled based on the comparison result signal; and a frequency dividing unit for dividing an output of the oscillating unit to generate a temperature compensated self refresh signal.

The other objectives and advantages of the invention will be understood by the following description and will also be appreciated by the embodiments of the invention more clearly. Further, the objectives and advantages of the invention will readily be seen that they can be realized by the means and its combination specified in the claims.

BRIEF DESCRIPTION OF THE DRAWINGS

The above and other objects and features of the instant invention will become apparent from the following description of preferred embodiments taken in conjunction with the accompanying drawings, in which.

DETAILED DESCRIPTION OF THE INVENTION

Hereinafter, preferred embodiments of the present invention will be set forth in detail with reference to the accompanying drawings so that the invention can be readily carried out by those in the art to which the invention pertains.

Figure 1:
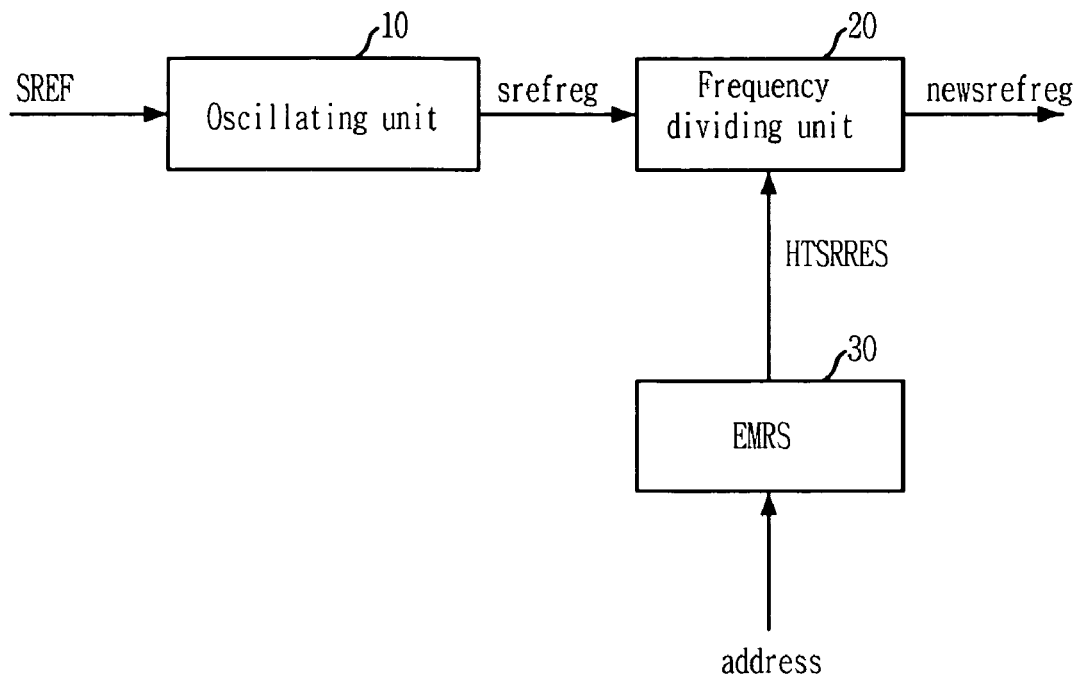
FIG. 1 shows a block diagram of a conventional memory device with a self refresh cycle control function.
Figure 2:
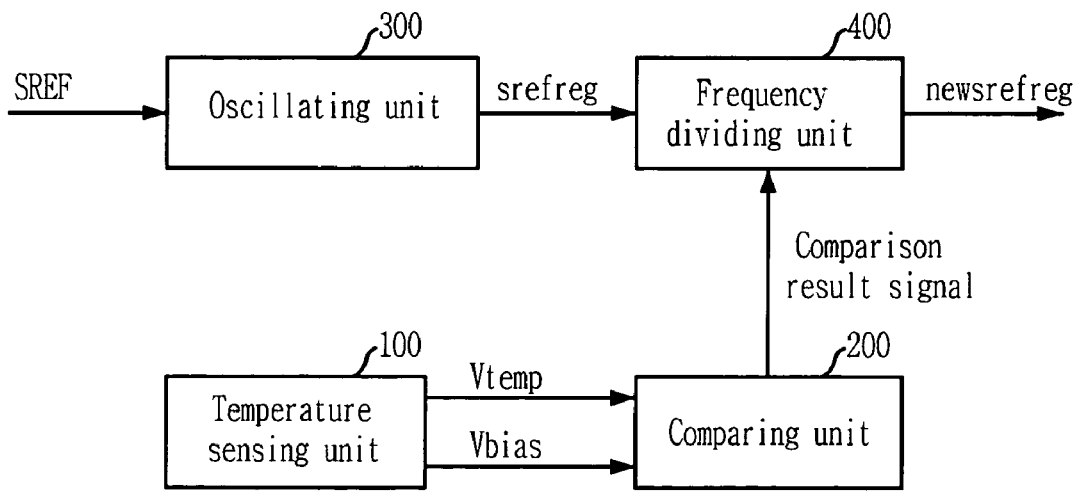
FIG. 2 is a block diagram illustrating a configuration of a memory device with a self refresh cycle control function in accordance with a first embodiment of the present invention.

FIG. 2 is a block diagram illustrating a configuration of a memory device with a self refresh cycle control function in accordance with a first embodiment of the present invention. Referring to FIG. 2, the memory device of the present invention includes a temperature sensing unit 100, a comparing unit 200, an oscillating unit 300 and a frequency dividing unit 400.

The temperature sensing unit 100 serves to generate a second voltage Vtemp dependent upon a temperature variation and a first voltage Vbias independent of the temperature variation. As described later referring to FIG. 3, the temperature sensing unit 100 applies a band gap reference circuit well known in the art.

At the comparing unit 200, the second voltage Vtemp is compared with the first voltage Vbias to produce a comparison result signal compare.

In the meantime, the oscillating unit 300 is enabled by a self refresh entry signal SREF to provide a basic self refresh signal srefreq.

At the frequency dividing unit 400, the basic self refresh signal srefreq is divided in response to the comparison result signal compare serving as a selection signal of divided value to thereby generate a final refresh signal newsrefreq.

Figure 3:
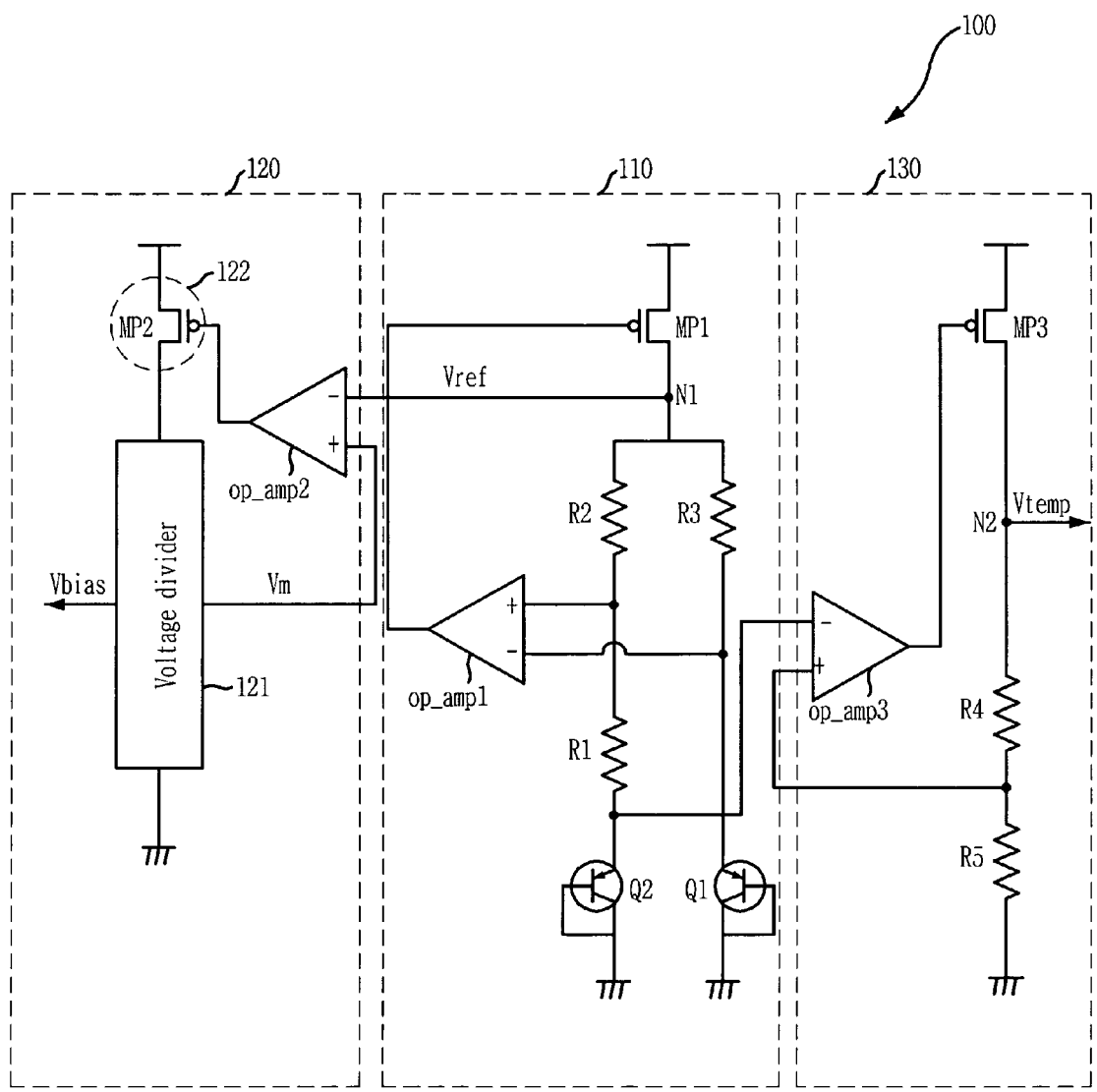
FIG. 3 illustrates a detailed circuit diagram of the temperature sensing unit shown in FIG. 2.

FIG. 3 illustrates a detailed circuit diagram of the temperature sensing unit 100 shown in FIG. 2. Referring to FIG. 3, the temperature sensing unit 100 includes a band gap reference voltage generator 110 for generating a reference voltage Vref of level independent of a process variation and temperature variation based on a junction voltage characteristic of bipolar transistors (junction voltage between the emitters and bases of Q1 and Q2) and thermal voltage characteristic (VT=kT/q), a first voltage generator 120 for providing the first voltage Vbias by using the reference voltage Vref, and a second voltage generator 130 for producing the second voltage Vtemp based on the junction voltage characteristic of bipolar transistor (junction voltage between the emitter and base of Q2).

More specifically, the band gap reference voltage generator 110 is provided with resistors R2 and R1 and a bipolar transistor Q2 for diode which are connected in serial between an output node N1 of the reference voltage Vref and a ground voltage terminal to constitute a first current path, a resistor R3 and a bipolar transistor Q1 for diode which are connected in series between the output node N1 of the reference voltage Vref and the ground voltage terminal to form a second current path, an operational amplifier op_amp1 whose positive input terminal is coupled with a connection node of the resistors R2 and R1 and negative input terminal is coupled with a connection node of the resistor R3 and the bipolar transistor Q1, and a PMOS transistor MP1 whose gate takes an output of the operational amplifier op_amp1 and source-drain path is established between a power supply voltage terminal Vdd and the output node N1.

The first voltage generator 120 is provided with a voltage divider 121 for dividing an input power supply voltage to provide the first voltage Vbias and a divided voltage Vm, an operational amplifier op_amp2 whose negative input terminal accepts the reference voltage Vref and positive input terminal receives the divided voltage Vm, and a current source 122 for supplying the power supply voltage to the voltage divider 121 in response to an output of the operational amplifier op_amp2. The current source 122 is composed of a PMOS transistor MP2 whose gate takes an output of the operational amplifier op_amp2 and source-drain path is connected between the power supply voltage terminal Vdd and the voltage divider 121. And the voltage divider 121 is formed with a plurality of resistors connected in series and provides the first voltage Vbias and the divided voltage Vm at any one of connection nodes of the resistors.

The second voltage generator 130 is equipped with resistors R4 and R5 connected in series between an output node N2 of the second voltage Vtemp and a ground voltage terminal Vss, an operational amplifier op_amp3 whose positive input terminal is coupled with a connection node of the resistors R4 and R5 and negative input terminal is connected to an emitter of the bipolar transistor Q2 of the band gap reference voltage generator 110, and a PMOS transistor MP3 whose gate takes an output of the operational amplifier op_amp3 and source-drain path is connected between the power supply voltage terminal and the output node N2.

Specifically, provided at the band gap reference voltage generator 110 of the temperature sensing unit 100 is the reference voltage Vref independent of the temperature variation while being insensitive to the process condition and variation of driving voltage. At the operational amplifier op_amp1, a certain voltage is issued to turn on the MOS transistor MP1. In response to the certain voltage, the MOS transistor MP1 is turned on; and thus, a current is supplied to the resistors R2 and R1 and R3, and in turn fixed voltages are applied to the two input terminals of the operational amplifier op_amp1. Due to such an operation, an output voltage of the operational amplifier op_amp1 is regulated and a turning-on rate of the MOS transistor MP1 is varied, thereby controlling an amount of current supplied to the resistors R2 and R3 through the MOS transistor MP1. This operation continues until same voltage levels are applied to the two input terminals of the operational amplifier op_amp1. When the same voltage levels are applied to the two input terminals of the operational amplifier op_amp1, the reference voltage Vref of fixed level is inputted to a common node of the resistors R2 and R3. The reference voltage Vref generated is then provided to the first voltage generator 120, and may be represented by:

$$\text{Vref}=\text{Vbe1}+(R2/R1)*VT*\ln(NR2/R3) \qquad \text{Eq. (1)}$$

In Eq. (1) denoting the reference voltage Vref, because a base-emitter voltage Vbel of the bipolar transistor has a negative coefficient of about −2 mv and VT has a positive coefficient with respect to temperature, the constant voltage Vref independent of temperature can be obtained by regulating a value of $(R2/R1)*\ln(NR2/N3)$ and absolutizing the two coefficients.

Meanwhile, the second voltage generator 130 amplifies the voltage applied to the emitter of the bipolar transistor Q2 to produce the second voltage Vtemp. The base-emitter voltage Vbel of the bipolar transistor Q2 has a negative value of about −2.1 mV/C with respect to increase in temperature, as described above. This may be used as the second voltage Vtemp as it is; but, in such a case, a varied amount of voltage sensed according to temperature variation is very small, thereby rendering its sensing difficult. Therefore, the voltage to the emitter of the bipolar transistor Q2 is amplified by the resistors R4 and R5 ratio and then outputted. At this time, the second voltage Vtemp has a lower level as the temperature becomes higher.

On the other hand, inputted to the first voltage generator 120 is the reference voltage Vref that is insensitive to the process condition and variation of driving voltage. The reference voltage Vref is divided at the voltage divider 121 to generate the first voltage Vbias and the divided voltage Vm. According to the spec of semiconductor memory, the standard temperature is 85° C.; and thus, if the voltage divider 121 is configured to provide the level of the second voltage Vtemp at 85° C. as the first voltage Vbias, the second voltage Vtemp and the first voltage Vbias have the same value when the temperature is 85° C.

Figure 4:
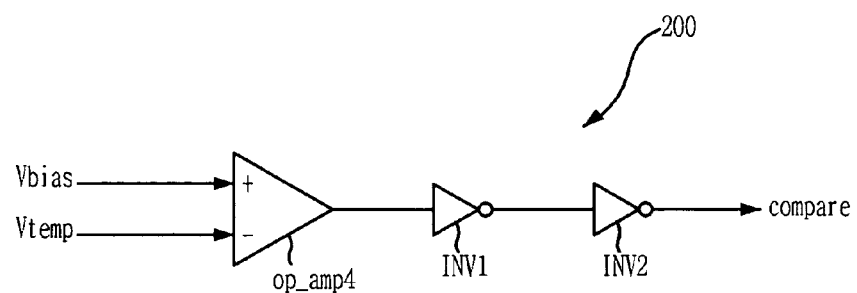
FIG. 4 illustrates a detailed circuit diagram of the comparing unit depicted in FIG. 2.

FIG. 4 illustrates a detailed circuit diagram of the comparing unit 200 depicted in FIG. 2. Referring to FIG. 4, the comparing unit 200 is provided with an operational amplifier op_amp4 whose negative input terminal is connected to the second voltage Vtemp and positive input terminal is connected to the first voltage Vbias, a first inverter INV1 for receiving an output of the operational amplifier op_amp4 as its input, and a second inverter INV2 for taking an output of the first inverter INV1 to provide a comparison result signal compare.

To be more specific, if the temperature is lower than 85° C., the level of the second voltage Vtemp would be higher than that of the first voltage Vbias; and therefore, an output of the comparing unit 200, the comparison result signal compare would be logic low. On the contrary, if the temperature is higher than 85° C., the level of the second voltage Vtemp would be lower than that of the first voltage Vbias; and thus, the comparison result signal compare would be logic high.

Figure 5:
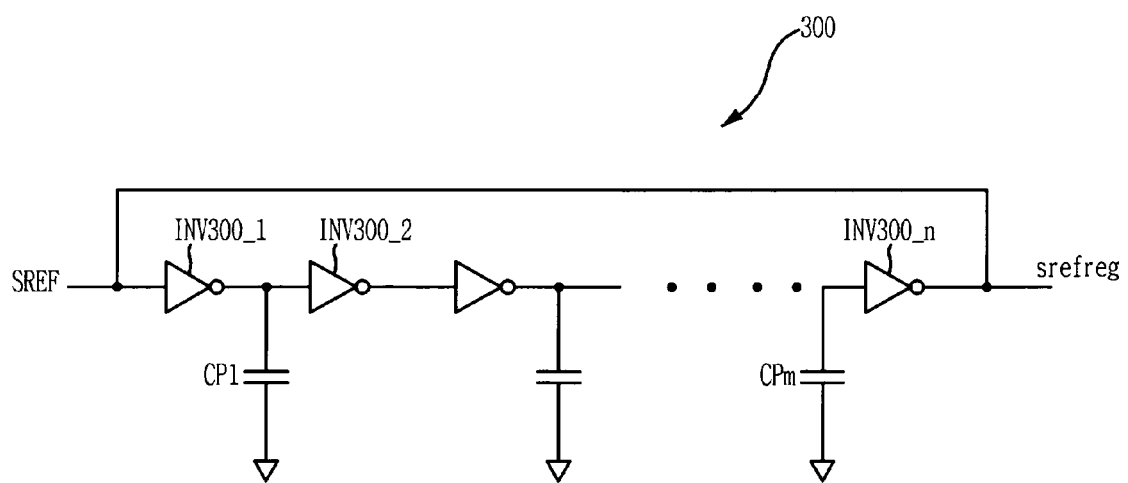
FIG. 5 exemplifies a detailed circuit diagram of the oscillating unit of FIG. 2.

FIG. 5 exemplifies a detailed circuit diagram of the oscillating unit 300 shown in FIG. 2. Referring to FIG. 5, the oscillating unit 300 is composed of an odd number of inverters INV300_1 to INV300_n connected in series, and a plurality of capacitors CPl to CPm, one terminal of each capacitor being connected to the ground and the other terminal being connected to at least one common node of an output terminal and an input terminal of each of the odd number of inverters. In this arrangement, the oscillating unit 300 receives a self refresh entry signal SREF and generates a signal srefreg having toggled basic refresh cycle.

Figure 6:
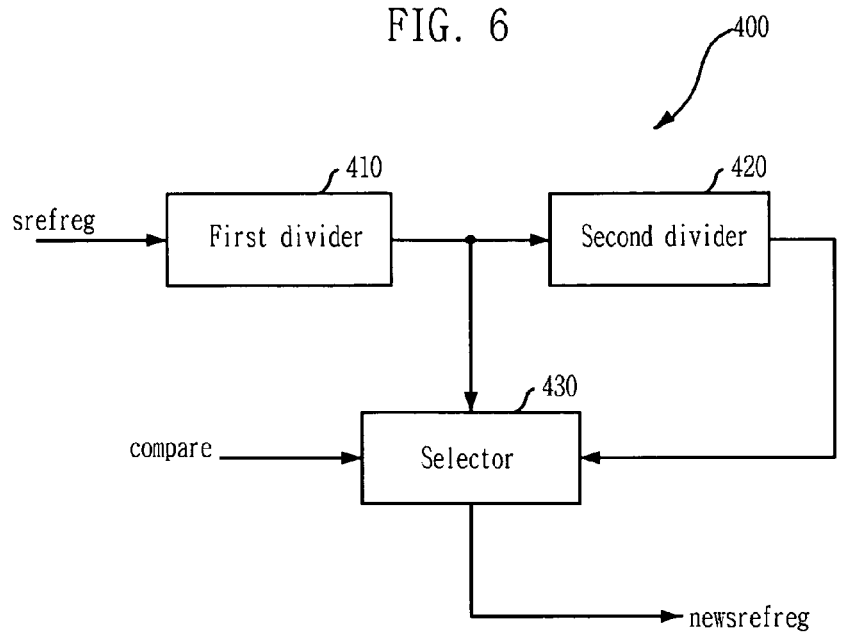
FIG. 6 provides a detailed block diagram of the frequency dividing unit shown in FIG. 2.

FIG. 6 provides a detailed block diagram of the frequency dividing unit 400 shown in FIG. 2. Referring to FIG. 6, the frequency dividing unit 400 is equipped with a first divider 410 for dividing the basic self refresh signal srefreg, a second divider 420 for dividing an output signal of the first divider 410, and a selector 430 for selecting one of output signals of the first and second dividers in response to the comparison result signal compare serving as a selection signal, and providing the selected output as a self refresh signal newsrefreg of finally temperature compensated cycle.

More concretely, the first divider 410 may be implemented with a ½ frequency divider, and the second divider 420 may be embodied by a single ½ frequency divider or a single ½$^n$ frequency divider, n being a natural number.

Figure 7:
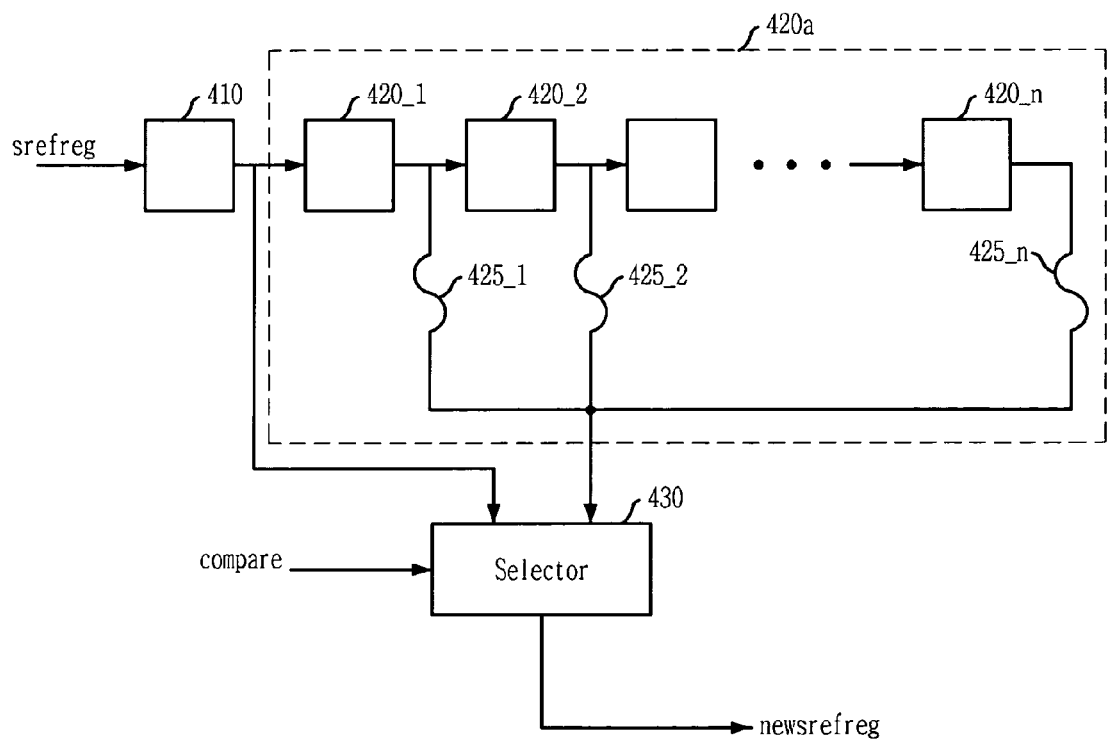
FIG. 7 is a block diagram illustrating another example of the frequency dividing unit depicted in FIG. 2.

FIG. 7 is a block diagram illustrating another embodiment of the frequency dividing unit 400 shown in FIG. 2. As shown in FIG. 7, the frequency dividing unit 420a is configured to generate a plurality of divided signals having different divided values; and includes a plurality of ½ frequency dividers 420_1 to 420_n connected in series, and fuses 425_1 to 425_n for selecting and providing any one of outputs of the plurality of unit frequency dividers 420_1 to 420_n by fuse blowing. In addition, metal option may be employed instead of the fuses. By considering that the amount of leakage current is varied and thus refresh cycle may be diverse due to external environments, an optimal refresh signal is selected by test and then only a corresponding fuse is turned on.

Figure 8:
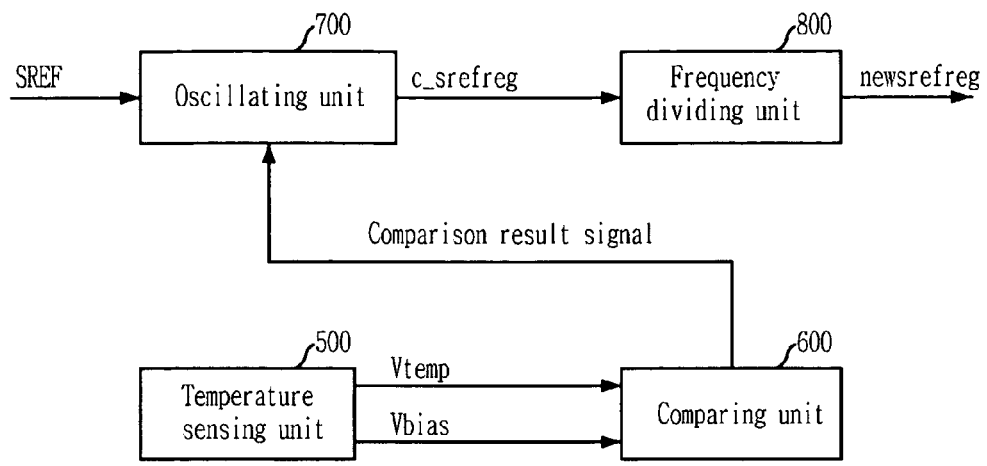
FIG. 8 exemplifies a block diagram of a memory device with a self refresh cycle control function in accordance with a second embodiment of the present invention.

FIG. 8 exemplifies a block diagram of a memory device with a self refresh cycle control function in accordance with a second embodiment of the present invention. Referring to FIG. 8, the memory device with the self refresh cycle control function includes a temperature sensing unit 500 for generating a second voltage Vtemp dependent upon a temperature variation and a first voltage Vbias independent of a temperature variation, a comparing unit 600 for comparing the second voltage Vtemp with the first voltage Vbias to provide a comparison result signal compare, an oscillating unit 700 for using the comparison result signal compare as its own capacitor enable signal and producing a self refresh signal c_srefreg corresponding to the temperature variation, and a frequency dividing unit 800 for accepting and dividing the self refresh signal c_srefreg to provide a refresh signal newsrefreg of finally temperature compensated cycle.

The temperature sensing unit 500 and the comparing unit 600 are substantially identical to those presented in the first embodiment as described above. Therefore, their details are omitted here; and other elements, the oscillating unit 700 and the frequency dividing unit 800 will be described below.

Figure 9:
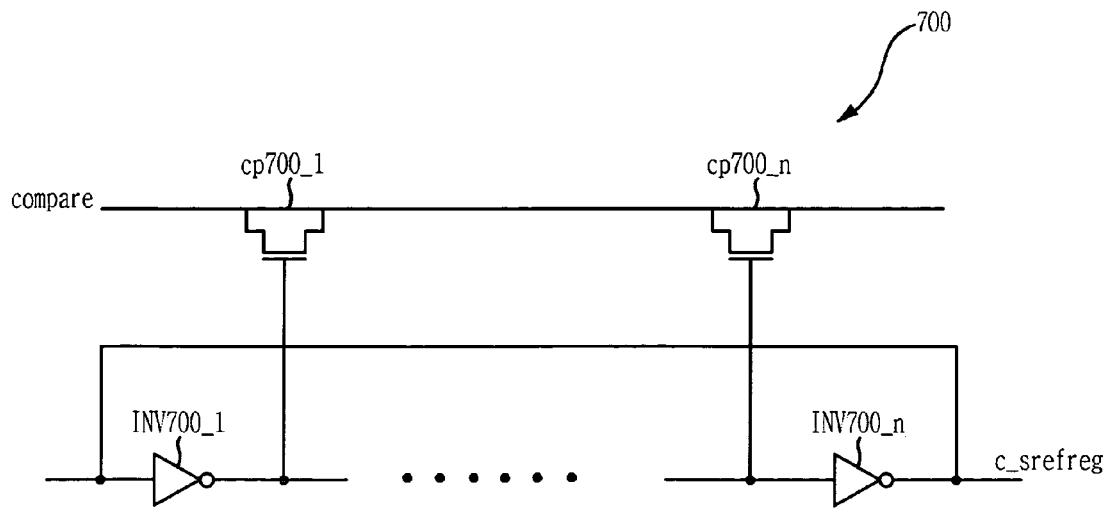
FIG. 9 illustrates a detailed circuit diagram of the oscillating unit presented in FIG. 8.

FIG. 9 illustrates a detailed circuit diagram of the oscillating unit 700 shown in FIG. 8. Referring to FIG. 9, the oscillating unit 700 is provided with an odd number of inverters INV700_1 to INV700_n connected in series, and a plurality of capacitors CP700_1 to CP700_n, in which one terminal of each capacitor receives the comparison result signal compare as a capacitor enable signal and the other terminal is connected between output terminals of each of the odd number of inverters INV700_1 to INV700_n. Specifically, the oscillating unit 700 uses the comparison result signal compare as the capacitor enable signal and turns on/off the plurality of capacitors CP700_1 to CP700_n, to thereby generate a self refresh signal c_srefreg having temperature compensated cycle. In such a configuration, if the temperature is lower than 85° C., the comparison result signal compare becomes logic low and thus the capacitors are enabled to produce a signal c_srefreg having long self refresh cycle; and if the temperature is higher than 85° C., the comparison result signal compare becomes logic high and thus specific capacitors are disabled to provide a signal c_srefreg having short self refresh cycle.

Figure 10:
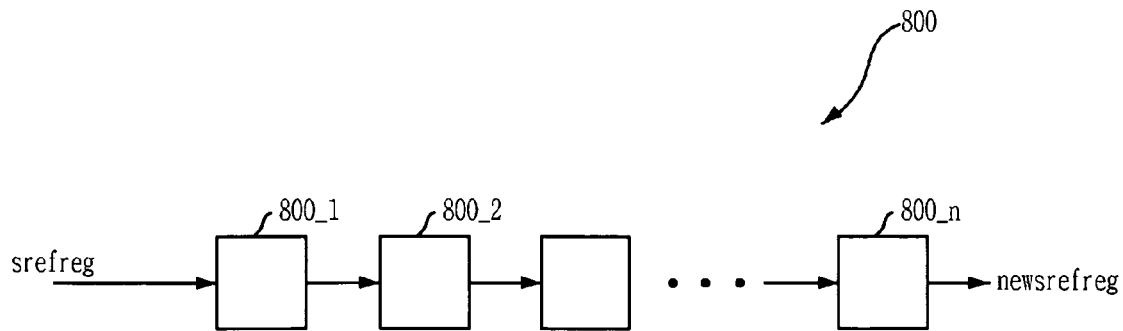
FIG. 10 exemplifies a detailed block diagram of the frequency dividing unit of FIG. 8.

FIG. 10 exemplifies a detailed block diagram of the frequency dividing unit 800 shown in FIG. 8. The frequency dividing unit 800 in accordance with the second embodiment of the present invention may be comprised of a single ½ frequency divider or a single ½$^n$ frequency divider, n being a natural number.

Figure 11:
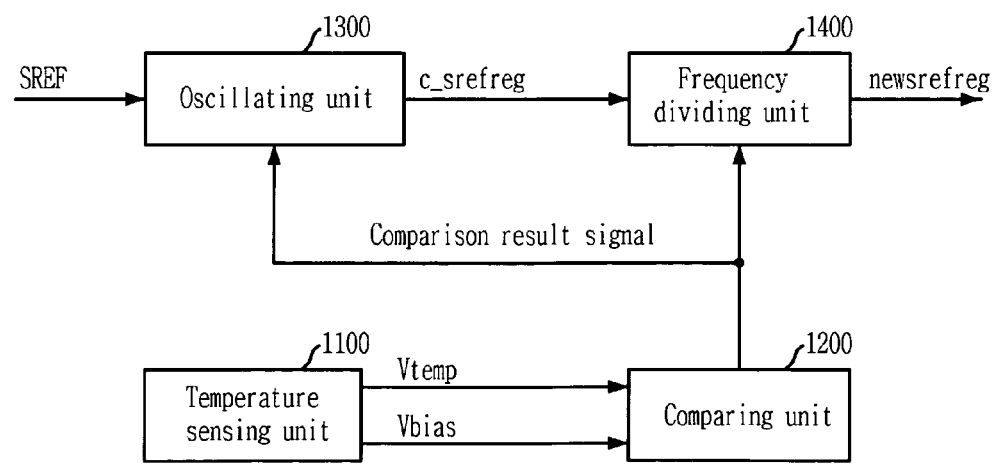
FIG. 11 illustrates a block diagram of a memory device with a self refresh cycle control function in accordance with a third embodiment of the present invention.

FIG. 11 illustrates a block diagram of a memory device with a self refresh cycle control function in accordance with a third embodiment of the present invention.

As illustrated in FIG. 11, it is implemented in such a way that both an oscillating unit 1300 and a frequency dividing unit 1400 are controlled by a comparison result signal compare.

In the third embodiment of the present invention, the oscillating unit 1300 may be structured as shown in FIG. 9 and the frequency dividing unit 1400 may be configured as shown in FIG. 6 or 7. Of course, the temperature sensing unit 1100 may be constructed as shown in FIG. 3 and the comparing unit 1200 may be configured as shown in FIG. 4.

As described above, the present invention is not by EMRS code setting but provided with a temperature sensing unit that senses temperature by applying a band gap reference circuit. Accordingly, the present invention can provide a memory device with a self refresh cycle control function which is more convenient for users to use by controlling a self refresh cycle by means of sensing a specific temperature through the use of the temperature sensing unit.

The present application contains subject matter related to Korean patent application Nos. 2005-90913 and 2006-49122, filed with the Korean Intellectual Property Office Sep. 29, 2005 and May 31, 2006, the entire contents of which are incorporated herein by reference.

While the present invention has been described with respect to the particular embodiments, it will be apparent to those skilled in the art that various changes and modifications may be made without departing from the spirit and scope of the invention as defined in the following claims.

What is claimed is:

1. A memory device with a self refresh cycle control function, comprising:
    a temperature sensing unit for generating a first voltage independent of a temperature variation and a second voltage dependent upon a temperature variation by using a band gap reference voltage generator;
    a comparing unit for comparing the first voltage with the second voltage to provide a comparison result signal; and
    a self refresh signal generating unit for receiving a self refresh entry signal and generating a self refresh signal of temperature compensated cycle under the control of the comparison result signal,
    wherein the comparing unit includes:
        a first operational amplifier whose negative input terminal is connected to the second voltage and positive input terminal is connected to the first voltage,
        a first inverter for receiving an output of the first operational amplifier, and
        a second inverter for taking an output of the first inverter to output the comparison result signal.

2. The memory device as recited in claim 1, wherein the temperature sensing unit includes:
    the band gap reference voltage generator for generating a reference voltage of level independent of a process variation and temperature variation;
    a first voltage generator for generating the first voltage by using the reference voltage; and
    a second voltage generator for producing the second voltage.

3. The memory device as recited in claim 2, wherein the band gap reference voltage generator includes:
    a first output node providing the reference voltage;
    a first and a second resistors and a first bipolar transistor for diode which are connected in series between the first output node and a ground voltage terminal and constitute a first current path;
    a third resistor and a second bipolar transistor for diode which are connected between the first output node and the ground voltage terminal and forms a second current path;
    a first operational amplifier whose positive input terminal is coupled with a connection node of the first and second resistors and negative input terminal is coupled with a connection node of the third resistor and the second bipolar transistor; and
    a first MOS transistor whose gate takes an output of the first operational amplifier and source-drain path is established between a power supply voltage terminal and the first output node.

4. The memory device as recited in claim 2, wherein the first voltage generator includes:
    a voltage divider for dividing a power supply voltage to provide the first voltage and a divided voltage;
    a second operational amplifier whose negative input terminal accepts the reference voltage and positive input terminal receives the divided voltage; and
    a current source for supplying the power supply voltage to the voltage divider in response to an output of the second operational amplifier.

5. The memory device as recited in claim 4, wherein the current source includes a second MOS transistor whose gate accepts the output of the second operational amplifier and source-drain path is connected between the power supply voltage terminal and the voltage divider.

6. The memory device as recited in claim 4, wherein the voltage divider is comprised of a plurality of resistors connected in series and provides the first voltage and the divided voltage at one of connection nodes of the plurality of resistors.

7. The memory device as recited in claim 3, wherein the second voltage generator includes:
    a fourth and a fifth resistors connected in series between a second output node outputting the second voltage and the ground voltage terminal;
    a third operational amplifier whose positive input terminal is coupled with a connection node of the fourth and the fifth resistors and negative input terminal is connected to an emitter of the first bipolar transistor; and
    a third MOS transistor whose gate takes an input of the third operational amplifier and source-drain path is connected between the power supply voltage terminal and the second output node.

8. A memory device with a self refresh cycle control function, comprising:
    a temperature sensing unit for generating a first voltage independent of a temperature variation and a second voltage dependent upon a temperature variation by using a band gap reference voltage generator;
    a comparing unit for comparing the first voltage with the second voltage to provide a comparison result signal;
    an oscillating unit for receiving and oscillating a self refresh entry signal; and
    a frequency dividing unit for dividing an output of the oscillating unit and providing one of a plurality of divided values as a self refresh signal in response to the comparison result signal,
    wherein the oscillating unit includes:
        an odd number of inverters connected in series, and
        a plurality of capacitors, one terminal of each capacitor being connected to the ground and the other terminal being connected to an output terminal of each of the odd number of inverters.

9. The memory device as recited in claim 8, wherein the frequency dividing unit includes:
    a first divider for dividing an output signal of the oscillating unit;
    a second divider for dividing an output signal of the first divider; and
    a selector for outputting one of output signals of the first and second dividers as a temperature compensated self refresh signal in response to the comparison result signal serving as a selection signal.

10. The memory device as recited in claim 9, wherein the first divider is a ½ frequency divider.

11. The memory device as recited in claim 10, wherein the second divider is a $½^n$ frequency divider, n being a natural number.

12. The memory device as recited in claim 9, wherein the second divider includes:
a plurality of ½ unit frequency dividers connected in series for generating a plurality of divided clocks having different divided values; and
a fuse unit for selecting and providing one of outputs of the plurality of ½ unit frequency dividers by fuse blowing.

13. The memory device as recited in claim 9, wherein the second divider includes:
a plurality of ½ unit frequency dividers connected in series for generating a plurality of divided clocks with different divided values; and
an option processor for selecting and providing one of outputs of the plurality of ½ unit frequency dividers by metal option process.

14. The memory device as recited in any one of claims 8 and 9 to 13, wherein the temperature sensing unit includes:
the band gap reference voltage generator for generating a reference voltage of level independent of a process variation and a temperature variation;
a first voltage generator for producing the first voltage by using the reference voltage; and
a second voltage generator for generating the second voltage.

15. The memory device as recited in claim 14, wherein the band gap reference voltage generator includes:
a first output node providing the reference voltage;
a first and a second resistors and a first bipolar transistor for diode which are connected in series between the first output node and a ground voltage terminal and constitute a first current path;
a third resistor and a second bipolar transistor for diode which are connected between the first output node and the ground voltage terminal and forms a second current path;
a first operational amplifier whose positive input terminal is coupled with a connection node of the first and second resistors and negative input terminal is coupled with a connection node of the third resistor and the second bipolar transistor; and
a first MOS transistor whose gate takes an output of the first operational amplifier and source-drain path is established between a power supply voltage terminal and the first output node.

16. The memory device as recited in claim 14, wherein the first voltage generator includes:
a voltage divider for dividing a power supply voltage to provide the first voltage and a divided voltage;
a second operational amplifier whose negative input terminal accepts the reference voltage and positive input terminal receives the divided voltage; and
a current source for supplying the power supply voltage to the voltage divider in response to an output of the second operational amplifier.

17. The memory device as recited in claim 15, wherein the second voltage generator includes:
a fourth and a fifth resistors connected in series between a second output node outputting the second voltage and the ground voltage terminal;
a third operational amplifier whose positive input terminal is coupled with a connection node of the fourth and the fifth resistors and negative input terminal is connected to an emitter of the first bipolar transistor; and
a third MOS transistor whose gate takes an input of the third operational amplifier and source-drain path is connected between the power supply voltage terminal and the second output node.

18. A memory device with a self refresh cycle control function, comprising:
a temperature sensing unit for generating a first voltage independent of a temperature variation and a second voltage dependent upon a temperature variation by using a band gap reference voltage generator;
a comparing unit for comparing the first voltage with the second voltage to provide a comparison result signal;
an oscillating unit for receiving and oscillating a self refresh entry signal, wherein an oscillating period is controlled based on the comparison result signal; and
a frequency dividing unit for dividing an output of the oscillating unit to generate a temperature compensated self refresh signal,
wherein the oscillating unit includes:
an odd number of inverters connected in series, and
a plurality of capacitors, one terminal of each capacitor receiving the comparison result signal as an enable signal and the other terminal being connected to an output terminal of each of the odd number of inverters.

19. The memory device as recited in claim 18, wherein the frequency divider is a $½^n$ frequency divider, n being a natural number.

20. The memory device as recited in claim 18, wherein the frequency divider includes:
a first divider for dividing an output signal of the oscillating unit;
a second divider for dividing an output signal of the first divider; and
a selector for outputting one of output signals of the first and second dividers as a temperature compensated self refresh signal in response to the comparison result signal serving as a selection signal.

21. The memory device as recited in claim 20, wherein the first divider is a ½ frequency divider.

22. The memory device as recited in claim 21, wherein the second divider is a $½^n$ frequency divider, n being a natural number.

23. The memory device as recited in claim 21, wherein the second divider includes:
a plurality of ½ unit frequency dividers connected in series for generating a plurality of divided clocks having different divided values; and
a fuse unit for selecting and providing one of outputs of the plurality of ½ unit frequency dividers by fuse blowing.

24. The memory device as recited in claim 21, wherein the second divider includes:
a plurality of ½ unit frequency dividers connected in series for generating a plurality of divided clocks having different divided values; and
an option processor for selecting and providing one of outputs of the plurality of ½ unit frequency dividers by metal option process.

25. The memory device as recited in any one of claims 18 and 19 to 24, wherein the temperature sensing unit:
the band gap reference voltage generator for generating a reference voltage of level independent of a process variation and a temperature variation;

a first voltage generator for generating the first voltage by using the reference voltage; and a second voltage generator for producing the second voltage.

26. The memory device as recited in claim 25, wherein the band gap reference voltage generator includes:

a first output node providing the reference voltage;

a first and a second resistors and a first bipolar transistor for diode which are connected in series between the first output node and a ground voltage terminal and constitute a first current path;

a third resistor and a second bipolar transistor for diode which are connected between the first output node and the ground voltage terminal and forms a second current path;

a first operational amplifier whose positive input terminal is coupled with a connection node of the first and second resistors and negative input terminal is coupled with a connection node of the third resistor and the second bipolar transistor; and a first MOS transistor whose gate takes an output of the first operational amplifier and source-drain path is established between a power supply voltage terminal and the first output node.

27. The memory device as recited in claim 25, wherein the first voltage generator includes:

a voltage divider for dividing a power supply voltage to provide the first voltage and a divided voltage;

a second operational amplifier whose negative input terminal accepts the reference voltage and positive input terminal receives the divided voltage; and a current source for supplying the power supply voltage to the voltage divider in response to an output of the second operational amplifier.

28. The memory device as recited in claim 26, wherein the second voltage generator includes:

a fourth and a fifth resistors connected in series between a second output node outputting the second voltage and the ground voltage terminal;

a third operational amplifier whose positive input terminal is coupled with a connection node of the fourth and the fifth resistors and negative input terminal is connected to an emitter of the first bipolar transistor; and a third MOS transistor whose gate takes an input of the third operational amplifier and source-drain path is connected between the power supply voltage terminal and the second output node.

* * * * *